(12) United States Patent
Das et al.

(10) Patent No.: US 10,476,444 B1
(45) Date of Patent: Nov. 12, 2019

(54) CROSS-FADING IN DUAL-PATH PULSE WIDTH MODULATION SYSTEM

(71) Applicant: Cirrus Logic International Semiconductor Ltd., Edinburgh (GB)

(72) Inventors: Tejasvi Das, Austin, TX (US); Xin Zhao, Austin, TX (US); Ku He, Austin, TX (US); Nishant Jain, Austin, TX (US); Lei Zhu, Austin, TX (US); Xiaofan Fei, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/142,498

(22) Filed: Sep. 26, 2018

(51) Int. Cl.
| | |
|---|---|
| *H03F 1/30* | (2006.01) |
| *H03F 3/187* | (2006.01) |
| *H03F 3/217* | (2006.01) |
| *H03F 3/213* | (2006.01) |
| *H03F 3/393* | (2006.01) |

(52) U.S. Cl.
CPC ............ *H03F 1/301* (2013.01); *H03F 3/187* (2013.01); *H03F 3/213* (2013.01); *H03F 3/2171* (2013.01); *H03F 3/393* (2013.01); *H03F 2200/03* (2013.01); *H03F 2200/129* (2013.01); *H03F 2200/135* (2013.01); *H03F 2200/264* (2013.01); *H03F 2200/351* (2013.01)

(58) Field of Classification Search
CPC .......... H03F 1/301; H03F 3/187; H03F 3/213; H03F 3/2171; H03F 3/393; H03F 2200/03; H03F 2200/129; H03F 2200/135; H03F 2200/264; H03F 2200/351
USPC ......................................... 381/121, 119, 123
See application file for complete search history.

(56) References Cited

U.S. PATENT DOCUMENTS

| | | | |
|---|---|---|---|
| 2007/0024365 A1* | 2/2007 | Ramaswamy ............ | H03F 1/30 330/251 |
| 2008/0284508 A1* | 11/2008 | Walker .................... | H03F 3/217 330/10 |
| 2010/0289546 A1* | 11/2010 | Dooper ................... | H03F 1/305 327/172 |
| 2011/0012674 A1* | 1/2011 | Midya ..................... | H03F 1/305 330/10 |

* cited by examiner

*Primary Examiner* — William A Jerez Lora
(74) *Attorney, Agent, or Firm* — Jackson Walker L.L.P.

(57) ABSTRACT

A system may include a plurality of playback paths comprising an open-loop playback path configured to drive an output load and a closed-loop playback path. The closed-loop playback path may include an outer feedback loop comprising one or more integrators, a quantizer, and an output driver for driving the output load, the outer feedback loop having an outer loop feedback gain and an inner feedback loop comprising the one or more integrators and the quantizer and excluding the output driver, wherein the inner feedback loop has a variable inner loop feedback gain which is adjustable to match the outer loop feedback gain.

20 Claims, 3 Drawing Sheets

CROSS-FADING IN DUAL-PATH PULSE WIDTH MODULATION SYSTEM

FIELD OF DISCLOSURE

The present disclosure relates in general to circuits for audio and haptic devices, including without limitation personal audio devices, such as wireless telephones and media players, or devices comprising a haptic module.

BACKGROUND

Personal audio devices, including wireless telephones, such as mobile/cellular telephones, cordless telephones, mp3 players, and other consumer audio devices, are in widespread use. Such personal audio devices may include circuitry for driving a pair of headphones or one or more speakers. Such circuitry often includes a power amplifier for driving an audio output signal to headphones or speakers. Generally speaking, a power amplifier amplifies an audio signal by taking energy from a power supply and controlling an audio output signal to match an input signal shape but with a larger amplitude.

One example of an audio amplifier is a class-D amplifier. A class-D amplifier (also known as a "switching amplifier") may comprise an electronic amplifier in which the amplifying devices (e.g., transistors, typically metal-oxide-semiconductor field effect transistors) operate as electronic switches. In a class-D amplifier, a signal to be amplified may be converted to a series of pulses by pulse-width modulation, pulse-density modulation, or another method of modulation, such that the signal is converted into a modulated signal in which a characteristic of the pulses of the modulated signal (e.g., pulse widths, pulse density, etc.) is a function of the magnitude of the signal. After amplification with a class-D amplifier, the output pulse train may be converted to an unmodulated analog signal by passing through a passive low-pass filter, wherein such low-pass filter may be inherent in the class-D amplifier or a load driven by the class-D amplifier. Class-D amplifiers are often used due to the fact that they may be more power efficient than linear analog amplifiers, in that class-D amplifiers may dissipate less power as heat in active devices as compared to linear analog amplifiers.

Typically, a closed-loop pulse width modulation (PWM) amplifier is chosen in order to provide accurate load voltage with desirable Total Harmonic Distortion (THD) and Power Supply Rejection Ratio (PSRR). A closed-loop PWM amplifier typically takes an analog voltage input and a sensed feedback voltage signal which are fed through a closed-loop analog PWM modulator to drive voltage on the speaker load.

However, an option to alternatively drive loads using a single PWM amplifier circuit in either open-loop or closed-loop depending on the specific application may be desirable. When using such a single PWM amplifier circuit, perceptible audio artifacts may occur when switching between open-loop operation and closed-loop operation, and thus, it may be desirable to reduce or eliminate such audio artifacts.

SUMMARY

In accordance with the teachings of the present disclosure, one or more disadvantages and problems associated with existing approaches to processing signals with an amplifier may be reduced or eliminated.

In accordance with embodiments of the present disclosure, a system may include a plurality of playback paths comprising an open-loop playback path configured to drive an output load and a closed-loop playback path. The closed-loop playback path may include an outer feedback loop comprising one or more integrators, a quantizer, and an output driver for driving the output load, the outer feedback loop having an outer loop feedback gain and an inner feedback loop comprising the one or more integrators and the quantizer and excluding the output driver, wherein the inner feedback loop has a variable inner loop feedback gain which is adjustable to match the outer loop feedback gain.

In accordance with these and other embodiments of the present disclosure, a system may include a control subsystem and a plurality of playback paths comprising an open-loop playback path configured to drive an output load. The control subsystem may be configured to select between the open-loop playback path and the closed-loop playback path to drive the output load and further configured to, in response to a condition for switching selection between the open-loop playback path and the closed-loop playback path, cross fade between the open-loop playback path and the closed-loop playback path by, during a duration of the cross fade: for each of a plurality of sets of pulse-width modulation periods for an output signal driven to the output load, switching in a deterministic pattern between the open-loop playback path and the closed-loop playback path; and for successive sets of the pulse-width modulation periods during the duration, an incidence of selection of a first of the open-loop playback path and the closed-loop playback path increases and an incidence of selection of a second of the open-loop playback path and the closed-loop playback path decreases.

In accordance with these and other embodiments of the present disclosure, a method may be provided for use in a system comprising a plurality of playback paths, the playback paths having an open-loop playback path configured to drive an output load and a closed-loop playback path having an outer feedback loop and an inner feedback loop wherein the outer feedback loop has one or more integrators, a quantizer, an output driver for driving the output load, and an outer loop feedback gain and wherein the inner feedback loop has the one or more integrators, the quantizer, and a variable inner loop feedback gain and excludes the output driver. The method may include adjusting the variable inner loop feedback gain to match the outer loop feedback gain.

In accordance with these and other embodiments of the present disclosure, a method may be provided for use in a system comprising a plurality of playback paths comprising an open-loop playback path configured to drive an output load and a closed-loop playback path configured to drive the output load. The method may include selecting between the open-loop playback path and the closed-loop playback path to drive the output load and, in response to a condition for switching selection between the open-loop playback path and the closed-loop playback path, cross fading between the open-loop playback path and the closed-loop playback path by, during a duration of the cross fade: for each of a plurality of sets of pulse-width modulation periods for an output signal driven to the output load, switching in a deterministic pattern between the open-loop playback path and the closed-loop playback path and for successive sets of the pulse-width modulation periods during the duration, an incidence of selection of a first of the open-loop playback path and the closed-loop playback path increases and an incidence of selection of a second of the open-loop playback path and the closed-loop playback path decreases.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
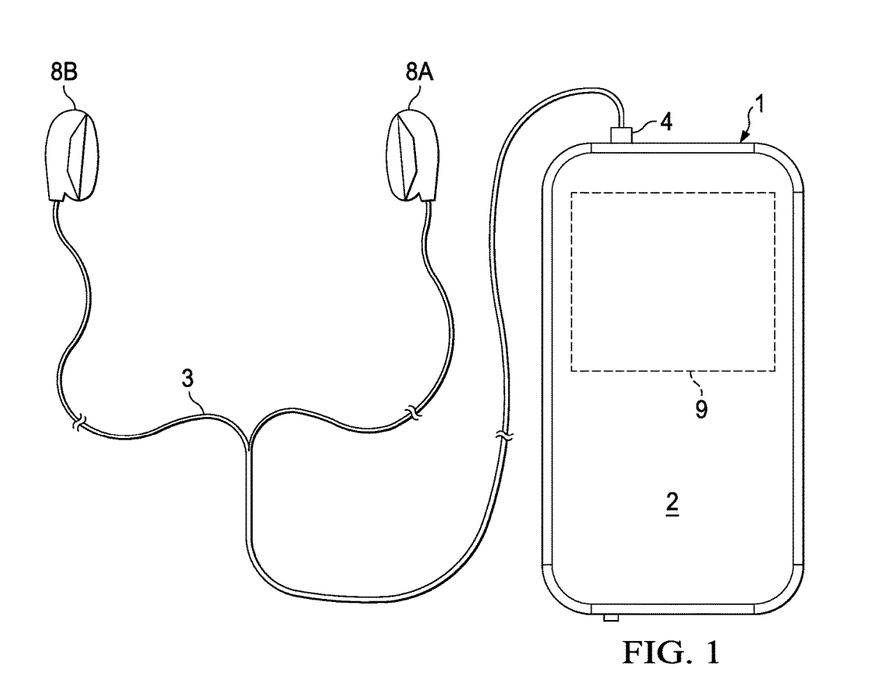
FIG. 1 is an illustration of an example personal audio device, in accordance with embodiments of the present disclosure.

FIG. 1 is an illustration of an example personal audio device 1, in accordance with embodiments of the present disclosure. FIG. 1 depicts personal audio device 1 coupled to a headset 3 in the form of a pair of earbud speakers 8A and 8B. Headset 3 depicted in FIG. 1 is merely an example, and it is understood that personal audio device 1 may be used in connection with a variety of audio transducers, including without limitation, headphones, earbuds, in-ear earphones, and external speakers. A plug 4 may provide for connection of headset 3 to an electrical terminal of personal audio device 1. Personal audio device 1 may provide a display to a user and receive user input using a touch screen 2, or alternatively, a standard liquid crystal display (LCD) may be combined with various buttons, sliders, and/or dials disposed on the face and/or sides of personal audio device 1. As also shown in FIG. 1, personal audio device 1 may include an audio integrated circuit (IC) 9 for generating an analog audio signal for transmission to headset 3 and/or another audio transducer (e.g., a loudspeaker).

Figure 2:
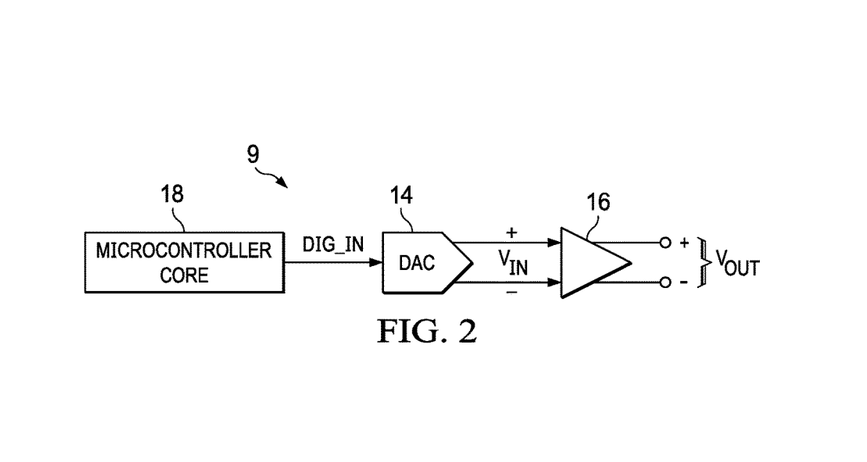
FIG. 2 is a block diagram of selected components of an example audio integrated circuit of a personal audio device, in accordance with embodiments of the present disclosure.

FIG. 2 is a block diagram of selected components of an example audio IC 9 of a personal audio device, in accordance with embodiments of the present disclosure. In some embodiments, example audio IC 9 may be used to implement audio IC 9 of FIG. 1. As shown in FIG. 2, a microcontroller core 18 (e.g., a digital signal processor or "DSP") may supply a digital audio input signal DIG_IN to a digital-to-analog converter (DAC) 14, which may convert the digital audio input signal to an analog input signal $V_{IN}$. DAC 14 may supply analog signal $V_{IN}$ to an amplifier 16 which may amplify or attenuate analog input signal $V_{IN}$ to provide an audio output signal $V_{OUT}$, which may operate a speaker, headphone transducer, a line level signal output, and/or other suitable output.

Figure 3:
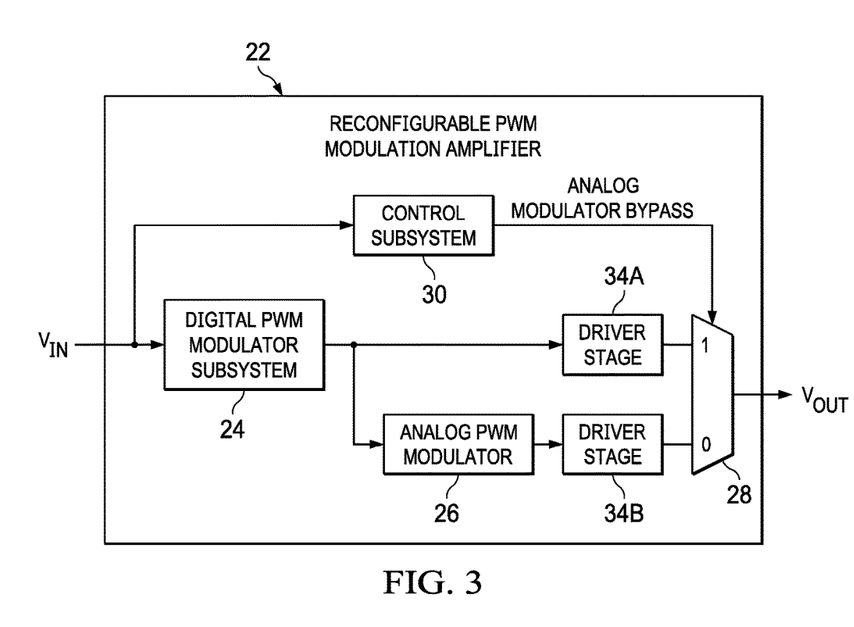
FIG. 3 is a block diagram of selected components of an example pulse width modulation amplifier, in accordance with embodiments of the present disclosure.

FIG. 3 is a block diagram of selected components of an example reconfigurable pulse width modulation amplifier 22, in accordance with embodiments of the present disclosure. In some embodiments, example reconfigurable pulse width modulation amplifier 22 may be used to implement amplifier 16 of FIG. 2. As shown in FIG. 3, example reconfigurable pulse width modulation amplifier 22 may include a digital PWM modulator subsystem 24 and an analog PWM modulator 26, along with a direct bypass function implemented with a multiplexer 28.

Reconfigurable PWM modulation amplifier 22 may be configured to operate in an analog closed-loop mode through the use of analog PWM modulator 26 when the ANALOG MODULATOR BYPASS control signal received by multiplexer 28 is deasserted. In the analog closed-loop mode, input signal $V_{IN}$ may be modulated by digital PWM modulator subsystem 24, analog PWM modulator 26 may receive its input from digital PWM modulator subsystem 24, and analog PWM modulator 26 may be utilized such that the output of analog PWM modulator 26, as received and driven by driver stage 34B, is driven as output signal $V_{OUT}$. Driver stage 34B may comprise a plurality of output switches configured to generate output signal $V_{OUT}$ from a modulated signal generated by analog PWM modulator 26.

Reconfigurable PWM modulation amplifier 22 may also be configured to operate in a digital open-loop mode through the use of digital PWM modulator subsystem 24 when the ANALOG MODULATOR BYPASS control signal received by multiplexer 28 is asserted. In the digital open-loop mode, analog PWM modulator 26 and a driver stage 34B driven by analog PWM modulator 26 may be bypassed by multiplexer 28, and digital PWM modulator subsystem 24 may be utilized such that input signal $V_{IN}$ is modulated by digital PWM modulator subsystem 24 and the output of digital PWM modulator subsystem 24, as received and driven by an open-loop driver stage 34A, is driven as output signal $V_{OUT}$. Driver stage 34A may comprise a plurality of output switches configured to generate output signal $V_{OUT}$ from a modulated signal generated by digital PWM modulator subsystem 24.

Changing reconfigurable PWM modulation amplifier 22 from the analog closed-loop mode and the digital open-loop mode (and vice versa) may be achieved by, through use of multiplexer 28, selecting which of driver stage 34A and driver stage 34B is to drive output signal $V_{OUT}$.

In some embodiments, a control subsystem 30 may be used to control multiplexer 28 in order to select a signal processing path for reconfigurable PWM modulation amplifier 22, for example by generating the ANALOG MODULATOR BYPASS control signal communicated from control subsystem 30 to multiplexer 28. For example, selection of such multiplexer control signal may be based on one or more characteristics of input signal $V_{IN}$ to the amplifier (e.g., magnitude, frequency, or other characteristic of input signal $V_{IN}$). Thus, reconfigurable PWM modulation amplifier 22 may comprise a digital pulse width modulator subsystem (e.g., digital PWM modulator subsystem 24), a first path coupled to an output of the digital pulse width modulator subsystem and configured to drive an open-loop driver stage (e.g., driver stage 34A), and a second path coupled to the output of the digital pulse width modulator subsystem and configured to drive a closed-loop analog pulse width modulator (e.g., analog PWM modulator 26), wherein one of the first path and the second path is selected for processing a signal based on one or more characteristics of the signal.

Advantageously, the foregoing provides systems and methods for implementing and using a system comprising a reconfigurable amplifier capable of switching between an analog closed-loop modulation amplifier and a digital open-loop modulation amplifier with minimal additional digital logic as compared to that of existing amplifier systems. However, the foregoing system may be susceptible to perceptible audio artifacts, such as "pops" and "clicks," unless steps are taken to reduce or avoid such artifacts. Accordingly, as described in greater detail below with respect to FIG. 4, control subsystem 30 of reconfigurable PWM modulation amplifier 22 may be configured to perform cross fading and/or controlling gains of closed-loop feedback paths associated with analog PWM modulator in order to minimize perceptible audio artifacts due to the switching.

Figure 4:
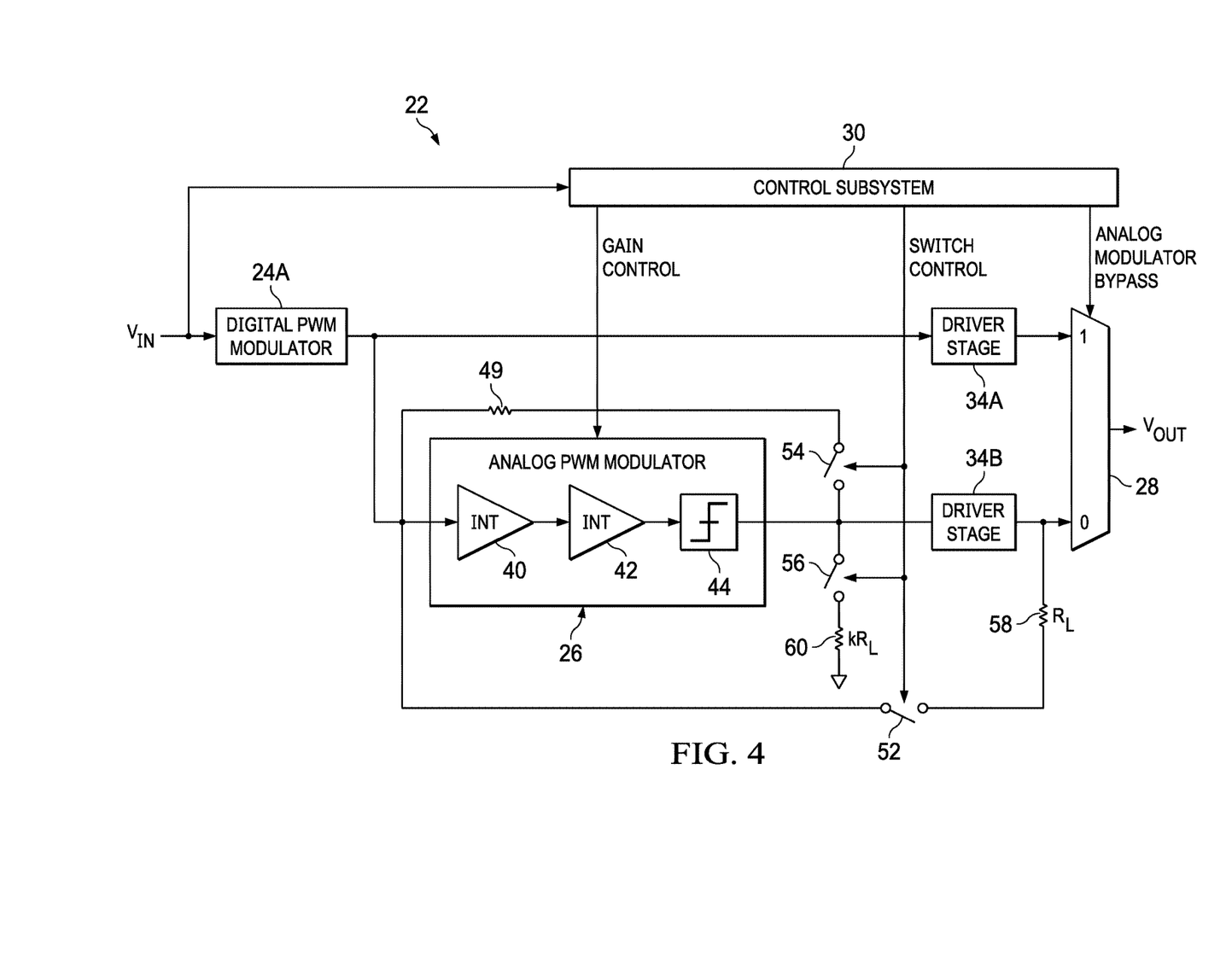
FIG. 4 is a block diagram of selected components of an example reconfigurable PWM modulator, including components for calibrating path gains, in accordance with embodiments of the present disclosure.

FIG. 4 is a block diagram of selected components of an example reconfigurable PWM modulation amplifier 22, in accordance with embodiments of the present disclosure. In some embodiments, reconfigurable PWM modulation amplifier 22 shown in FIG. 4 may be used to implement reconfigurable PWM modulation amplifier 22 of FIG. 3. As shown in FIG. 4, a digital PWM modulator 24A may be used to implement digital PWM modulator subsystem 24, and analog PWM modulator 26 may include a first-stage integrator 40 followed by one or more additional stage integrators 42, which are in turn followed by a quantizer 44 that may generate an analog PWM signal to driver stage 34B.

As depicted in FIG. 4, reconfigurable PWM modulation amplifier 22 may comprise an open-loop playback path, implemented with digital PWM modulator 24A and driver stage 34A, configured to drive an output load. Also as depicted in FIG. 4, reconfigurable PWM modulation amplifier 22 may comprise a closed-loop playback path having an outer feedback loop and an inner feedback loop. The outer feedback loop may include analog PWM modulator 26, driver stage 34B, and a feedback path including resistor 58 and switch 52. The outer feedback loop may also have an outer loop feedback gain which may be defined by elements of the outer feedback loop (e.g., analog PWM modulator 26, driver stage 34B, and the feedback path including resistor 58 and switch 52). The inner feedback loop may include analog PWM modulator 26 and a feedback path including resistor 49 and switch 54, but excluding driver stage 34B. As shown in FIG. 4, reconfigurable PWM modulation amplifier 22 may also include a switch 56 and a resistor 60 such that when switch 56 is activated (e.g., turned on, enabled, etc.), resistor 60 is coupled between the output of analog PWM modulator 26 and a ground voltage. As shown in FIG. 4, resistor 58 may have a resistance of $R_L$ while resistor 60 may have a resistance $kR_L$, where k is any suitable constant value. The inner feedback loop may also have an inner loop feedback gain which may be defined by elements of the inner feedback loop (e.g., analog PWM modulator 26, the feedback path including resistor 49 and switch 54, and resistor 60).

In operation, control subsystem 30 may be configured to, when driver stage 34A is selected as the driver stage that drives output voltage $V_{OUT}$, cause switches 52, 54, and 56 to be deactivated (e.g., turned off, disabled, etc. by communicating appropriate one or more control signals labeled SWITCH CONTROL in FIG. 4), thus disabling the closed-loop playback path, and potentially reducing power consumption by effectively deactivating the closed-loop playback path. Subsequently, responsive to a condition (e.g., a characteristic of input signal $V_{IN}$ meeting a particular condition) for switching from driver stage 34A as the driver stage that drives output voltage $V_{OUT}$ to driver stage 34B as the driver stage that drives output voltage $V_{OUT}$, control subsystem 30 may, prior to toggling the ANALOG MODULATOR BYPASS control signal to switch between the selected playback paths for driving the output, enable the inner feedback loop by activating switches 54 and 56 (e.g., by communicating appropriate one or more control signals labeled SWITCH CONTROL in FIG. 4) and varying the inner loop feedback gain to match the outer loop feedback gain (e.g., by communicating appropriate one or more control signals labeled GAIN CONTROL in FIG. 4). Control subsystem 30 may vary the inner loop feedback gain in any suitable manner, including varying a gain of analog PWM modulator 26 (e.g., by varying a supply voltage which supplies electrical energy to quantizer 44). As a specific example, if a gain of driver stage 34B is x, control subsystem 30 may set the gain of analog PWM modulator 26 to x/k, such that when such gain is multiplied by the gain of resistor 56 having resistance $kR_L$, the overall inner loop feedback gain is a function of the quantity $xR_L$, equivalent to the outer loop feedback gain.

After varying the inner loop feedback gain to match the outer loop gain, control subsystem 30 may deactivate the inner feedback loop (e.g., by deactivating switches 54 and 56) and activate the outer feedback loop (e.g., by activating switch 52). After deactivating the inner feedback loop and activating the outer feedback loop, control subsystem 30 may toggle the ANALOG MODULATOR BYPASS control signal to switch from driver stage 34A for driving the output to driver stage 34B for driving the output.

By setting the inner feedback loop gain to match the outer loop gain prior to toggling the ANALOG MODULATOR BYPASS control signal, control subsystem 30 may reduce or eliminate audible artifacts from occurring during switching between signal paths. When the inner loop feedback gain is set to match the outer loop gain prior to switching, various state variables of analog PWM modulator 26 (including the electrical states of internal electrical nodes, capacitor charge levels, etc.) may not change significantly at the time of switching between paths, which may be critical to ensuring that any changes in the loop gain and state variables and output glitches resulting from the switching between paths are below audible levels.

In some embodiments, control subsystem 30 may set the variable inner loop feedback gain product testing of reconfigurable PWM modulation amplifier 22 (or a system to which reconfigurable PWM modulation amplifier 22 is integral) to compensate for process variations between reconfigurable PWM modulation amplifier 22 and similar reconfigurable PWM modulators. In these and other embodiments, control subsystem 30 may dynamically vary the variable inner loop feedback gain in real-time while content (e.g., audio content, haptic playback waveforms, etc.) of the input signal is being played back to a transducer. In such embodiments, control subsystem 30 may dynamically vary the variable inner loop feedback gain to compensate for changes in one or more of a temperature associated with the system and loading by the output load driven by output voltage $V_{OUT}$.

In these and other embodiments, when switching from selection of driver stage 34A for driving the output load to selection of driver stage 34B for driving the output load, and vice versa (e.g., in response to a characteristic of input signal $V_{IN}$ meeting a particular condition) control subsystem 30 may cause cross fading between selection of the driver stages 34. In particular, control subsystem 30 may cause such cross fade to occur over a particular duration in which the particular duration has a plurality of sets of pulse-width modulation periods of the PWM output signal $V_{OUT}$. In each of the sets of pulse-width modulation periods, control subsystem 30 may cause switching of multiplexer 28 in a deterministic pattern between selection of driver stage 34A (i.e., the open-loop playback path) and driver stage 34B (i.e., the closed-loop playback path). For successive sets of the pulse-width modulation periods during the particular duration, an incidence of selection of one of driver stages 34 may increase and an incidence of selection of the other of driver stages 34 may decrease.

An example of this cross fade procedure may be further illustrated below. While the cross fade procedure may be applied to switching of selection from driver stage 34A to driver stage 34B and switching of selection from driver stage 34B to driver stage 34A, the following illustrative example will consider the instance of switching of selection from driver stage 34A to driver stage 34B. Further, while the cross fade procedure may be implemented using any suitable duration and any suitable number of pulse-width modulation periods, the following illustrative example will, for purposes of clarity and exposition, assume the duration of cross fade occurs over six sets of pulse-width modulation periods, each set comprising five pulse-width modulation periods. In addition, in the following example, the value "A" will represent selection of driver stage 34A as driving the output in a particular pulse-width modulation period of output signal $V_{OUT}$ and the value "B" will represent selection of driver stage 34B as driving the output in a particular pulse-width modulation period of output signal $V_{OUT}$. The example is illustrated by the table below which depicts a chronology of the sets of pulse-width modulation periods and a deterministic pattern (as indicated by a value of "A" or "B") between selection of driver stage 34 for driving output signal $V_{OUT}$:

| Set of pulse-width modulation periods | Deterministic pattern of pulse-width modulation periods |
| --- | --- |
| 1 | AAAAA |
| 2 | AAAAB |
| 3 | AAABB |
| 4 | AABBB |
| 5 | ABBBB |
| 6 | BBBBB |

Although the foregoing period depicts a particular order for the occurrences of values "A" and "B" for each of the deterministic patterns, the order of such values in each deterministic pattern may be any suitable order. For example, for the set of pulse-width modulation periods labeled as "2", the deterministic pattern could be "AAABA," "AABAA," "ABAAA," or "BAAAA." As another example, in some embodiments, the order of values of the deterministic pattern may be randomized, which may reduce or eliminate systematic signal tones or glitch energy created by the switching.

In some embodiments, control subsystem 30 may cause every transition between value "A" and value "B", and vice versa, to occur when the instantaneous PWM output signal $V_{OUT}$ is zero. This may be accomplished by using a fixed-phase relationship between quantizer clocks of each of the signal paths and a clock of control subsystem 30 used to execute the analog cross fading process described above.

In these and other embodiments, the entire cross fading process may occur at the oversampled PWM frequency. In these and other embodiments, the entire cross fading process may be carried out at a zero crossing of an input signal (e.g., input signal $V_{IN}$) and a zero crossing of a pulse width modulation signal (e.g., output signal $V_{OUT}$) derived from the input signal within the system.

Although the foregoing contemplates use of reconfigurable PWM modulation amplifier 22 for use in an audio amplifier for driving an audio transducer, it is understood that reconfigurable PWM modulation amplifier 22 may be used in other types of amplifiers for driving other types of transducers, including without limitation an amplifier for driving a haptic transducer.

Thus, in accordance with the systems and methods provided herein, a control subsystem may be configured to cross fade between an open-loop playback path and a closed-loop playback path by, during a duration of the cross fade, for each of a plurality of sets of pulse-width modulation periods for an output signal driven to the output load, switching in a deterministic pattern between the open-loop playback path and the closed-loop playback path, and, for successive sets of the pulse-width modulation periods during the duration, an incidence of selection of a first of the open-loop playback path and the closed-loop playback path increasing and an incidence of selection of a second of the open-loop playback path and the closed-loop playback path decreasing.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. A system comprising a plurality of playback paths, the playback paths comprising:
   an open-loop playback path configured to drive an output load; and
   a closed-loop playback path comprising:
      an outer feedback loop comprising one or more integrators, a quantizer, and an output driver for driving the output load, the outer feedback loop having an outer loop feedback gain; and
      an inner feedback loop comprising the one or more integrators and the quantizer and excluding the output driver, wherein the inner feedback loop has a variable inner loop feedback gain which is adjustable to match the outer loop feedback gain.

2. The system of claim 1, wherein the variable inner loop feedback gain is established during product testing of the system to compensate for process variations between the system and similar systems.

3. The system of claim 1, wherein the variable inner loop feedback gain is dynamically varied in real-time while content of an input signal is being played back to a transducer.

4. The system of claim 1, wherein the variable inner loop feedback gain is dynamically varied to compensate for changes in one or more of a temperature associated with the system and loading by the output load.

5. The system of claim 1, wherein the system further comprises:
   a digital pulse width modulator subsystem; and
   wherein:
      the open-loop playback path is coupled to an output of the digital pulse width modulator subsystem;
      the closed-loop playback path is coupled to the output of the digital pulse width modulator subsystem and comprises a closed-loop analog pulse width modulator; and
      one of the open-loop playback path and the closed-loop playback path is selected for processing an input signal received by the system based on one or more characteristics of the input signal.

6. A system comprising:
   a plurality of playback paths, the playback paths comprising:
      an open-loop playback path configured to drive an output load; and
      a closed-loop playback path configured to drive the output load; and
   a control subsystem configured to select between the open-loop playback path and the closed-loop playback path to drive the output load and further configured to, in response to a condition for switching selection between the open-loop playback path and the closed-loop playback path, cross fade between the open-loop playback path and the closed-loop playback path by, during a duration of the cross fade:
      for each of a plurality of sets of pulse-width modulation periods for an output signal driven to the output load, switching in a deterministic pattern between the open-loop playback path and the closed-loop playback path; and
      for successive sets of the pulse-width modulation periods during the duration, an incidence of selection of a first of the open-loop playback path and the closed-loop playback path increasing and an incidence of selection of a second of the open-loop playback path and the closed-loop playback path decreasing.

7. The system of claim 6, wherein the system further comprises:
   a digital pulse width modulator subsystem; and
   wherein:
      the open-loop playback path is coupled to an output of the digital pulse width modulator subsystem;
      the closed-loop playback path is coupled to the output of the digital pulse width modulator subsystem and comprises a closed-loop analog pulse width modulator; and
      one of the open-loop playback path and the closed-loop playback path is selected for processing an input signal received by the system based on one or more characteristics of the input signal.

8. The system of claim 6, wherein the control subsystem is further configured to perform the cross fade at one of a zero crossing of the input signal and a zero crossing of a pulse width modulation signal derived from an input signal within the system.

9. The system of claim 6, wherein for each of the plurality of sets of pulse-width modulation periods for an output signal driven to the output load, the deterministic pattern is randomized.

10. The system of claim 6, wherein the closed-loop playback path comprises:
   an outer feedback loop comprising one or more integrators, a quantizer, and an output driver for driving the output load, the outer feedback loop having an outer loop feedback gain; and
   an inner feedback loop comprising the one or more integrators and the quantizer and excluding the output driver, wherein the inner feedback loop has a variable inner loop feedback gain which is adjustable to match the outer loop feedback gain.

11. A method comprising, in a system comprising a plurality of playback paths, the playback paths having an open-loop playback path configured to drive an output load and a closed-loop playback path having an outer feedback loop and an inner feedback loop wherein the outer feedback loop has one or more integrators, a quantizer, an output driver for driving the output load, and an outer loop feedback gain and wherein the inner feedback loop has the one or more integrators, the quantizer, and a variable inner loop feedback gain and excludes the output driver:
   adjusting the variable inner loop feedback gain to match the outer loop feedback gain.

12. The method of claim 11, further comprising establishing the variable inner loop feedback gain during product testing of the system to compensate for process variations between the system and similar systems.

13. The method of claim 11, further comprising dynamically varying the variable inner loop feedback gain in real-time while content of an input signal is being played back to a transducer.

14. The method of claim 11, further comprising dynamically varying the variable inner loop feedback gain to compensate for changes in one or more of a temperature associated with the system and loading by the output load.

15. The method of claim 11, wherein:
the system further comprises:
    a digital pulse width modulator subsystem; and
    wherein:
        the open-loop playback path is coupled to an output of the digital pulse width modulator subsystem; and
        the closed-loop playback path is coupled to the output of the digital pulse width modulator subsystem and comprises a closed-loop analog pulse width modulator; and
the method further comprising selecting one of the open-loop playback path and the closed-loop playback path for processing an input signal received by the system based on one or more characteristics of the input signal.

16. A method comprising, in a system comprising a plurality of playback paths comprising an open-loop playback path configured to drive an output load and a closed-loop playback path configured to drive the output load:
    selecting between the open-loop playback path and the closed-loop playback path to drive the output load; and
    in response to a condition for switching selection between the open-loop playback path and the closed-loop playback path, cross fading between the open-loop playback path and the closed-loop playback path by, during a duration of the cross fade:
        for each of a plurality of sets of pulse-width modulation periods for an output signal driven to the output load, switching in a deterministic pattern between the open-loop playback path and the closed-loop playback path; and
        for successive sets of the pulse-width modulation periods during the duration, an incidence of selection of a first of the open-loop playback path and the closed-loop playback path increasing and an incidence of selection of a second of the open-loop playback path and the closed-loop playback path decreasing.

17. The method of claim 16, wherein:
the system further comprises:
    a digital pulse width modulator subsystem; and
    wherein:
        the open-loop playback path is coupled to an output of the digital pulse width modulator subsystem; and
        the closed-loop playback path is coupled to the output of the digital pulse width modulator subsystem and comprises a closed-loop analog pulse width modulator; and
the method further comprises selecting one of the open-loop playback path and the closed-loop playback path for processing an input signal received by the system based on one or more characteristics of the input signal.

18. The method of claim 16, further comprising performing the cross fade at one of a zero crossing of the input signal and a zero crossing of a pulse width modulation signal derived from an input signal within the system.

19. The method of claim 16, further comprising, for each of the plurality of sets of pulse-width modulation periods for the output signal driven to the output load, randomizing the deterministic pattern.

20. The method of claim 16, wherein the closed-loop playback path comprises:
    an outer feedback loop comprising one or more integrators, a quantizer, and an output driver for driving the output load, the outer feedback loop having an outer loop feedback gain; and
    an inner feedback loop comprising the one or more integrators and the quantizer and excluding the output driver, wherein the inner feedback loop has a variable inner loop feedback gain which is adjustable to match the outer loop feedback gain.

\* \* \* \* \*

UNITED STATES PATENT AND TRADEMARK OFFICE
CERTIFICATE OF CORRECTION

| | | |
|---|---|---|
| PATENT NO. | : 10,476,444 B1 | Page 1 of 1 |
| APPLICATION NO. | : 16/142498 | |
| DATED | : November 12, 2019 | |
| INVENTOR(S) | : Das et al. | |

It is certified that error appears in the above-identified patent and that said Letters Patent is hereby corrected as shown below:

In the Specification

1. In Column 6, Lines 13-14, delete "resistor 56" and insert -- resistor 60 --, therefor.

Signed and Sealed this
Ninth Day of June, 2020

Andrei Iancu
*Director of the United States Patent and Trademark Office*